US 6,740,207 B2

(12) United States Patent
Kloeppel et al.

(10) Patent No.: US 6,740,207 B2
(45) Date of Patent: May 25, 2004

(54) ELECTRIC SUPPLY UNIT AND METHOD FOR REDUCING ARCING DURING SPUTTERING

(75) Inventors: Andreas Kloeppel, Glauburg (DE); Christoph Daube, Alzenau (DE); Johannes Stollenwerk, Gelnhausen (DE); Thomas Linz, Bühl (DE)

(73) Assignee: Unaxis Deutschland GmbH, Alzenau (DE)

( * ) Notice: Subject to any disclaimer, the term of this patent is extended or adjusted under 35 U.S.C. 154(b) by 0 days.

(21) Appl. No.: 10/108,666

(22) Filed: Mar. 28, 2002

(65) Prior Publication Data

US 2002/0104753 A1 Aug. 8, 2002

Related U.S. Application Data

(63) Continuation of application No. PCT/IB00/01195, filed on Aug. 29, 2000.

(30) Foreign Application Priority Data

Oct. 13, 1999 (DE) .......................................... 199 49 394

(51) Int. Cl.[7] ............................ C23C 14/34; B23K 15/00
(52) U.S. Cl. .............................. 204/192.1; 204/192.32; 204/298.08; 204/298.34; 219/121.34
(58) Field of Search ...................... 204/192.1, 192.12, 204/192.32, 293.08, 298.13, 298.16, 298.34, 298.37; 219/121.34

(56) References Cited

U.S. PATENT DOCUMENTS

| 5,192,894 | A | | 3/1993 | Teschner | .................. 315/11.24 |
| 5,698,982 | A | | 12/1997 | Teschner | ............... 204/298.03 |
| 6,031,699 | A | * | 2/2000 | Dollar et al. | .................. 361/42 |
| 6,365,009 | B1 | * | 4/2002 | Ishibashi | ............... 204/192.12 |

FOREIGN PATENT DOCUMENTS

| JP | 56065981 | 6/1981 | ........... C23C/15/00 |
| JP | 09217171 | 8/1997 | ........... C23C/14/10 |
| JP | 10168558 | 6/1998 | ........... C23C/14/08 |

OTHER PUBLICATIONS

English translation of JP 9-217171.*

* cited by examiner

*Primary Examiner*—Steven VerSteeg
(74) *Attorney, Agent, or Firm*—Notaro & Michalos P.C.

(57) ABSTRACT

Sparking is suppressed during high-frequency sputtering by a high-frequency generator (5) which has a controlled switching unit (13) that is connected upstream in relation to the output of the generator. A high-frequency supply signal that is generated at the output of the high-frequency generator is stopped for plasma discharge (PL) for a short time, by the switching unit.

33 Claims, 3 Drawing Sheets

ELECTRIC SUPPLY UNIT AND METHOD FOR REDUCING ARCING DURING SPUTTERING

CROSS REFERENCE TO RELATED APPLICATION

This is a continuation of international application no. PCT/IB00/01195, filed Aug. 29, 2000, and claims priority on German application no. DE 199 49 394.4, filed Oct. 13, 1999.

FIELD AND BACKGROUND OF THE INVENTION

The present invention relates to an electric supply unit, a sputtering installation as well as a method for reducing arcing during sputtering, and further a fabrication method.

The present invention builds on the following problem. The findings gained according to the invention, can be generally applied for HF-supplied sputtering processes.

During magnetron sputtering of ITO layers of oxide targets and supply of the plasma discharge, combined of HF and DC, the development of arcs is sporadically observed. This is not surprising, for the occurrence of such arcs is known in the case of DC sputtering of electrically poorly conducting materials, be that for sputter etching or for sputter coating. Several different approaches are known in order to avoid the development of arcs during DC sputtering, which could considerably damage workpieces during sputter etching as well as during sputter coating. For example the DC supply is superimposed by an HF supply component or work is carried out through operating point stabilization in so-called intramode or the DC supply is chopped so that the plasma discharge path is intermittently short-circuited across a relatively low-ohmic current path, while the DC supply is cut out.

It is thus all the more surprising that, in spite of the HF supply superimposed on the DC supply, said arcing was observed and an arc once developed continued to burn even if, according to experience from DC-supplied sputtering technology, the DC supply component had been deactivated.

SUMMARY OF THE INVENTION

The present invention builds on the surprisingly resulting task of suppressing the arc development during HF sputtering—generally sputter coating or sputter etching—at least so fast that the workpiece being worked is not damaged.

For this purpose, a supply unit of the type described in the introduction is proposed, which is developed according to the invention. Consequently, the supply unit according to the invention is developed such that the HF supply of the sputter plasma discharge is briefly deactivated.

In a first preferred embodiment of the supply unit according to the invention the switching unit controlling the deactivation comprises a control input, which is operationally connected with the output of an arc detection unit. It thereby becomes possible to deactivate the high-frequency supply of the plasma discharge immediately when an arc is developing.

The HF generator provided for the supply comprises in the conventional manner an electric supply unit which, for example, converts an input-side mains voltage into a DC supply voltage for the succeeding HF oscillator.

In a preferred embodiment of the unit according to the invention the switching unit provided for the deactivation according to the invention of the high-frequency supply succeeds said supply unit internal to the HF generator, i.e. it is disposed between the output of said supply unit and that of the HF generator. This can take place succeeding said generator supply unit up to the output side of an impedance matching unit provided conventionally and, in the present case, considered to be part of the generator.

In a preferred embodiment of the supply unit according to the invention equipped with an arc detection unit the latter comprises a DC potential measuring unit, whose output is operationally connected with the input of a preferably adjustable threshold value detection unit, whose output, in turn, acts as the output of the arc detection unit.

It is known that even with the exclusive HF supply of a plasma discharge, DC potentials—DC potential drops across the electrode dark spaces, essentially constant DC potential along the remaining plasma path—are generated along the plasma discharge path, whose values change detectably when a low-ohmic arc path is generated.

In a further preferred embodiment of the supply unit according to the invention the deactivation time of the HF supply is maximally 40 $\mu$sec., preferably even maximally 30 $\mu$sec.

It is thereby attained that, on the one hand, an arc in the process of developing is extinguished or, as will yet be explained, cannot even form and simultaneously a stable discharge is immediately continued in operation.

In a further preferred embodiment it is attained, in particular when the deactivation of the HF supply triggered by arc detection is provided, that, in addition to the previously described rapid switching in again, after the detection of the arc development, the HF supply is rapidly switched out such that the arc which is in the process of developing cannot fully develop. This is attained thereby that the time interval between arc detection and switching-out of the high-frequency supply is maximally 50 $\mu$sec, preferably maximally 30 $\mu$sec.

In a further preferred embodiment the switching unit provided according to the invention is developed in the manner of a monostable unit. Triggered by a detection signal at the output of the provided arc detection unit, the high-frequency supply is thereby deactivated for the preferably adjustable time interval, and subsequently is again switched in. If subsequently, acquired by the arc detection unit, measured values indicating arcs continue to be present, the HF supply is again deactivated. Controlled by the arc detection, a repetitive switching in and out of said supply occurs, until the arc detection unit no longer triggers the switching-out of the supply. But the supply switch-out remains to be dependent on the detection of at least one arc in the process of developing.

But in a further preferred embodiment this is circumvented thereby that in free-running mode the HF supply is repetitively deactivated for brief periods of time.

In a further preferred embodiment of the supply unit according to the invention, in addition to said HF generator, a DC generator is provided, whose output signal is superimposed onto that of the HF generator.

The DC generator further preferred comprises also a controlled switching unit, by means of which the DC supply signal can be deactivated for a brief time.

If, for the triggering or deactivation of the HF supply an arc detection unit is provided, the latter can also drive the deactivation of the DC supply. It is understood that this can also take place directly or thereby that in mutual time dependence, as will yet be explained, HF and DC supply can be deactivated or switched in.

At the supply unit according to the invention the mutually dependent time driving of the provided controlled switching units takes place such that the DC supply is deactivated before the HF supply. The HF supply is switched in again before or after the DC supply, preferably after.

The supply unit according to the invention is realized in a preferred embodiment utilizing a DC supply of type "Pinnacle" by the firm Advanced Energy.

Preferred embodiments of the sputter installation according to the invention are specified in the claims as are preferred embodiments of the method according to the invention.

The present invention, furthermore, relates to a fabrication method, by means of which the resulting sputtered—sputter-etched or sputter-coated—structural components can be produced with increased quality or with significantly reduced rejects due to at least strongly reduced effects of arcs.

BRIEF DESCRIPTION OF THE DRAWINGS

In the following the invention will be explained by example in conjunction with Figures. Therein depict.

DESCRIPTION OF THE PREFERRED EMBODIMENTS

Figure 1:
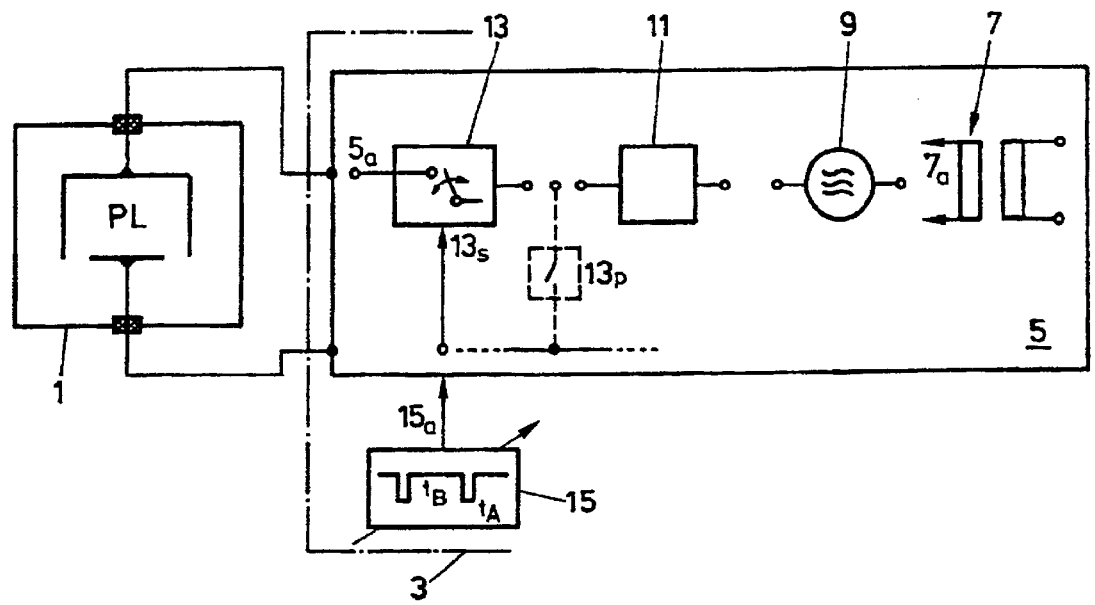
FIG. 1 is a schematic and function block/signal flow diagram of a first embodiment of the supply unit according to the invention, operating according to the method according to the invention, in a sputter installation according to the invention for the fabrication according to the invention, with free-running arc prevention.

In conjunction with a simplified function block/signal flow diagram, in FIG. 1 is schematically shown a first embodiment of the supply unit according to the invention switched into a sputter chamber conjointly forming a sputter installation according to the invention.

The sputter chamber 1 can be a sputter coating chamber or a sputter etching chamber, therein, as shown, a diode sputter chamber or (not shown) a triode or even multi-electrode sputter chamber.

In any case and as sufficiently known, in the sputter chamber 1 a plasma discharge path PL is provided between at least two electrodes.

The type and structure of the sputter chamber 1 is of secondary importance for the present invention, but it is essential that at least a portion of the plasma discharge supply takes place by means of HF energy. According to FIG. 1, a supply unit 3 according to the invention is provided. It comprises an HF generator 5 with a power supply unit 7, an HF oscillator unit 9, and an active or passive, optionally adjustable matching unit 11 (matchbox). According to the invention between an output $7_a$ of the power supply unit 7 and an output $5_a$ of the generator 5, which is connected with the plasma discharge path PL, a controlled switching unit 13 is provided, for example, according to the depiction of FIG. 1, directly preceding output $5_a$. The switching unit 13 comprises a control input $13_S$ which is connected with output $15_a$ of a freely oscillating clock generator 15. With the freely oscillating clock generator 15 the switching unit 13 is switched during first time intervals $t_A$ such that at output $5_a$ the HF supply is switched out and, during second time intervals $t_B$, is switched in. With respect to the clock ratios is recommended:

duty cycle: $(t_B/(t_B+t_A)) \geq 0.9$ deactivation times: $t_A \leq 100$ μsec.

The controlled switching unit 13 can therein be developed as a series chopper (as shown) or as a parallel chopper, as indicated at $13_P$ in dashed lines.

Figure 2:
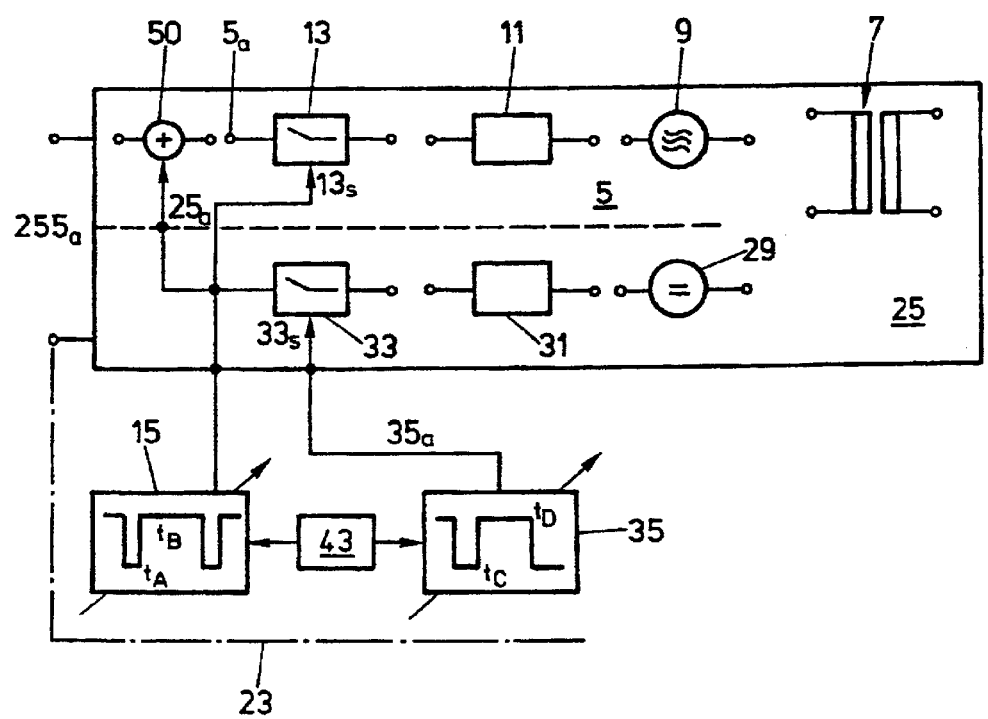
FIG. 2 in a representation analogous to FIG. 1 of a further development with DC and HF supply.

FIG. 2 shows a further embodiment according to the invention of the freely oscillating embodiment, already represented in principle in FIG. 1, inter alia of the supply unit according to the invention.

The same references are applied for the function blocks and signals, which were already described in conjunction with FIG. 1.

Apart from the HF generator 5, according to FIG. 2 the supply unit 23 according to the invention comprises a DC generator 25. As shown, HF generator 5 and DC generator 25 can therein be supplied by the same supply unit 7.

The DC generator 25 comprises a DC voltage generation stage 29, succeeding it conventionally a low-pass filter unit 31, and a controlled switching unit 33. The output $25_a$ of the DC generator and $5_a$ of the HF generator 5 are superimposed at a superimposition stage 50, which can also be formed by a conjointly connected electrode of the plasma discharge path PL according to FIG. 1.

Just as the control input $13_S$ of switching unit 13 is operationally connected with the clock generator 15, so is a control input $33_S$ of switching unit 33 operationally connected with the output $35a$ of a clock generator 35. Therewith the DC supply signal is switched in and switched out at output $255_a$ of the supply unit 23 or at DC output $25_a$. During third time intervals $t_C$ the DC supply is deactivated by clock generator 35, during fourth time intervals $t_D$ switched in. The two clock generators 15 and 35, which can be realized entirely conjointly, are in principle operated in mutual time dependence, as shown with the synchronization unit 43.

In a preferred embodiment, with respect to the time ratios $t_A$ to $t_D$, the following applies:

the time intervals $t_C$ start before time intervals $t_A$, i.e. the DC supply is switched out before the HF supply.

Preferably, further, the particular time interval $t_C$ is terminated before $t_A$ is terminated, i.e. the DC supply is switched in before the HF supply is switched in in both cases again.

Preferably the following time ratios apply:

$0.25 \leq t_C/t_A \leq 0.5$.

In principle, the switch-in time intervals $t_B$ and $t_D$ are further significantly longer than the switch-out time intervals $t_A$ or $t_C$.

Based on the representations of FIGS. 1 and 2, many variants are open to a person skilled in the art for realizing the supply unit according to the invention such that primarily the HF supply is intermittently briefly deactivated and, if additionally a DC supply is provided, it is also deactivated synchronized with the HF supply deactivation.

Figure 3:
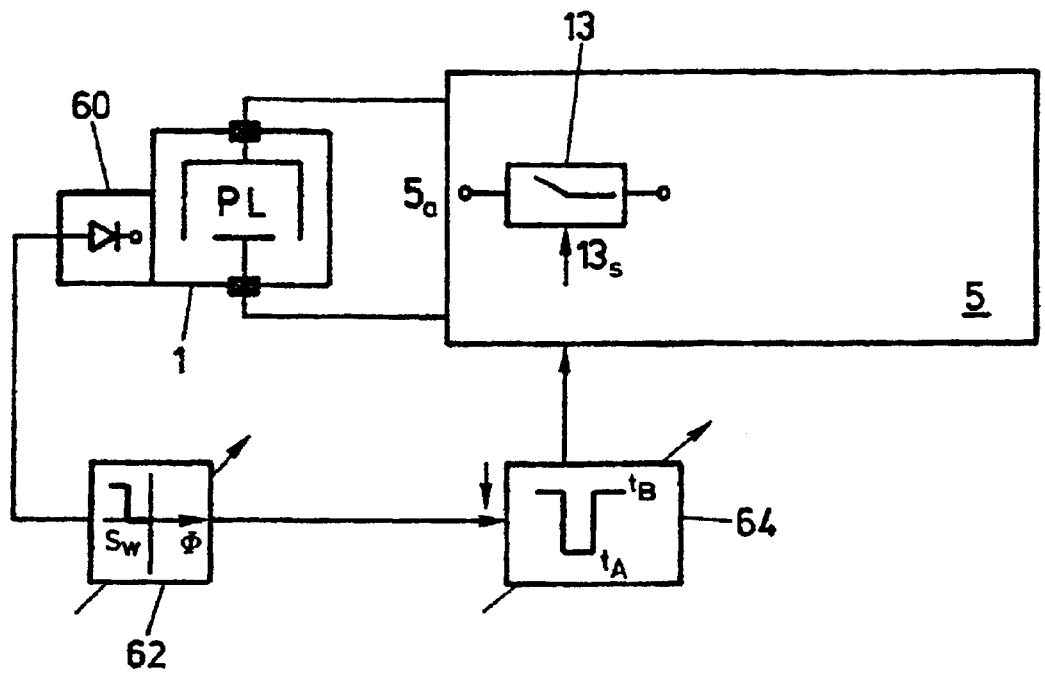
FIG. 3 is a schematic diagram building on the technology depicted in FIG. 1 of an embodiment with supply deactivation controlled by arc development.
Figure 4:
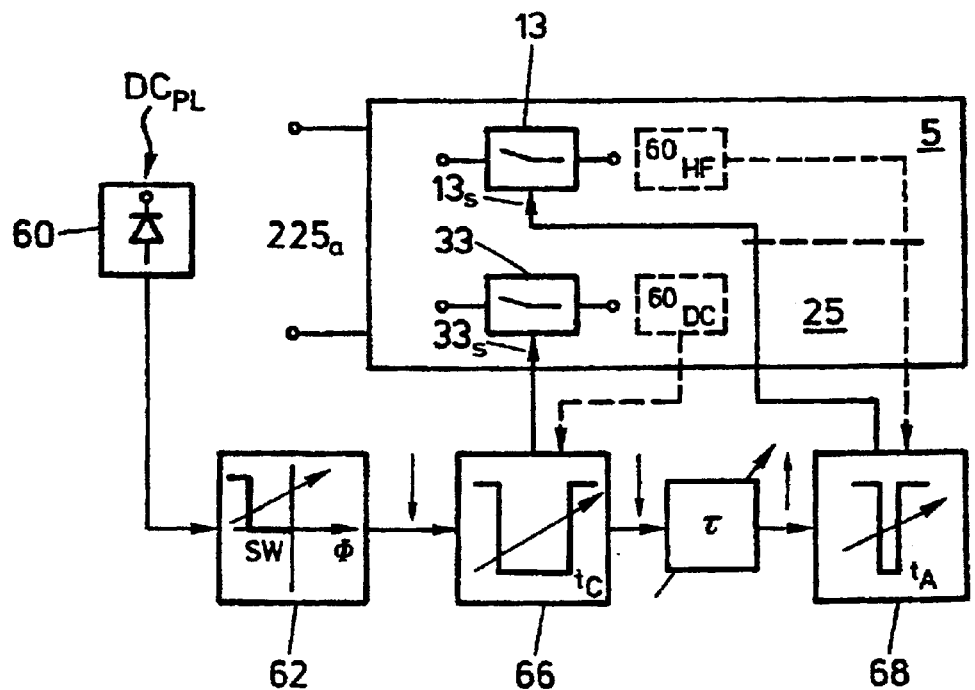
FIG. 4 is a schematic diagram building on the technology according to FIG. 2 of an embodiment of supply interruption triggered by arc development.

In analogy to FIGS. 1 and 2, in each of FIGS. 3 and 4 a further preferred embodiment of the supply unit according to the invention is shown, in which the supply interruption in terms of HF, or HF and DC, does not take place freely oscillatingly but rather triggered by the detection of arc development in the sputter chamber.

With respect to FIGS. 3 and 4, only the differences with respect to FIGS. 1 and 2 will be described.

According to FIG. 3 an arc detection unit 60 is provided on the supply unit according to the invention. In a preferred embodiment, it acquires a DC potential $DC_{PL}$, due to a plasma discharge. On a preferably adjustable threshold value unit 62 it is determined whether this monitored DC potential $\phi$, for example the plasma potential, reaches the set threshold value SW, based on which conclusions are drawn regarding the development of an arc. The threshold value unit 62 triggers at the output side a time control unit 64, which outputs, in the manner of a monostable multivibrator, a deactivation control signal of the preferably adjustable length $t_A$ to the controlled switching unit 13. Consequently, in this embodiment the HF supply is deactivated briefly, $t_A$, if the development of an arc in the plasma discharge PL is detected, for example if the plasma potential decreases due to the low-ohmic arc conductive connection.

If thereupon, through the time control unit 64 the HF supply is again switched in ($t_B$), the stable plasma discharge PL continues unless, via the detection unit 60, continuously or again the development of an arc is being detected. If the latter is the case, the HF supply is again deactivated via the units 62, 64. Repetitive switching-out of the HF supply takes place until no arcs are any longer detected.

It is understood that the detection unit 60, shown in FIG. 3 schematically coupled to the sputter chamber 1 or its plasma discharge PL, can also, and this preferably, be operationally connected for acquiring the electric discharge conditions, directly with the feed lines to the discharge electrodes.

Building on FIG. 2, in FIG. 4 the corresponding arc development-controlled supply unit is schematically represented for the combined HF and DC supply.

According to FIG. 4, with the detection of at least the development of an arc via the detection unit 60 and the threshold value unit 62, preferably, first, the time control unit 66, in the manner of a monostable unit, is driven for the deactivation of the DC supply according to the deactivation time interval $t_C$. As a function of the latter, preferably displaced by an adjustable time interval T, the HF supply is deactivated via the time control unit 68. Within the DC deactivation phase $t_C$ it is entirely possible to employ the HF supply repeatedly and, with further detection of an arc, to deactivate it again.

Figure 5:
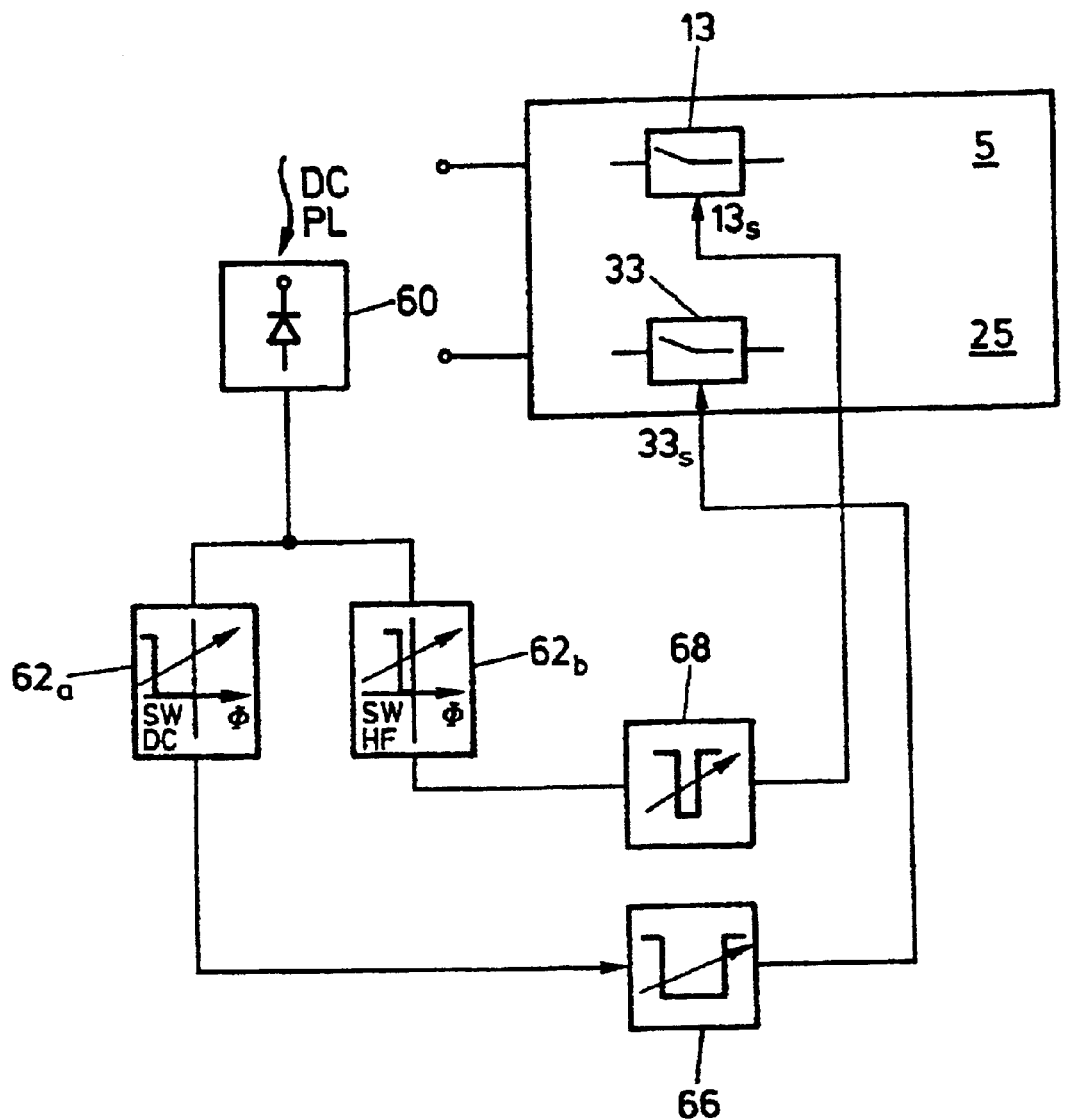
FIG. 5 is a diagram of a further embodiment of the technology explained in conjunction with FIG. 4.

Building on FIG. 4, in FIG. 5 a further embodiment is depicted, according to which, in response to threshold values, DC and/or HF supply are deactivated.

According to this Figure, at the outside side of the detection unit 60 which receives potential DC PL, a check for reaching a first threshold value SW-DC is carried out on the threshold value unit 62$a$ and for reaching a second threshold value SW-HF, on threshold value unit 62$b$. Upon reaching the threshold value SW-DC, via the time control unit 66 the DC supply is deactivated and, upon reaching the threshold value SW-HF, via unit 68 the HF supply is deactivated.

It is understood that now several feasibilities are open to a person skilled in the art to provide, in the case of DC and HF supply, combinations of time control and threshold value control and to deactivate briefly DC and HF supply each optimally staggered in time.

In a preferred embodiment, arc detection unit 60, threshold value unit 62, and time setting unit 66 with the DC generator 25 are realized in the embodiment according to FIG. 4 or 5 employing a DC feed of type "Pinnacle" by the firm Advanced Energy.

If it is taken into consideration that conventionally DC signals are decoupled from the input of the HF oscillator and that, conversely, HF signals are isolated from the input of the DC generators, it is evident that in a preferred embodiment an HF arc detection unit is connected succeeding the HF oscillator and a DC arc detection unit succeeding the DC generator. In FIG. 4 this is shown in dashed lines at 60$_{DC}$ and 60$_{HF}$. Each of these acts onto their associated time setting units 66 (DC) or 68 (HF).

In the embodiment according to FIGS. 3 to 5 preferably, starting with the detection, i.e. with reaching the corresponding threshold value with the development of an arc, until the deactivation of the HF supply, a time interval T of $\leq 50\,\mu sec$ is set.

In a preferred embodiment the supply unit according to the invention is combined with a sputter coating chamber, in particular preferred with a magnetron sputter chamber. The described supply is therein especially suitable for sputtering poorly conducting materials, in particular of metal oxides, therein in particular of ITO, preferably by magnetron sputtering.

In magnetron sputtering of ITO targets with an HF power density $P_{HF}$ of 0.75 W/cm$^2$ and a DC supply power density $P_{DC}$ of 0.75 W/cm$^2$ in an installation in principle built according to FIG. 4, starting with the detection of the arc development, the supply switch-out (HF and DC) already takes place after 500 $\mu$sec. With increased DC power density of 1.5 W/cm$^2$ this time interval was less than 1 $\mu$sec.

With the supply unit according to the invention, the sputter installation according to the invention or the method according to the invention, it becomes possible to operate HF sputter processes and in particular also HF/DC sputter processes under control even with tendencies to arcing. Due to the capability of limiting the arc event to less than 1 $\mu$sec, stable process operation is made possible. With the fabrication process according to the invention the quality of surfaces in sputter etching or sputter coating of said type is significantly increased and thus the number of workpiece rejects decreased. Damage through arcing on target, workpieces or on portions of the chamber wall are largely avoided.

While a specific embodiment of the invention has been shown and described in detail to illustrate the application of the principles of the invention, it will be understood that the invention may be embodied otherwise without departing from such principles.

What is claimed is:

1. An electric supply unit for electrical feeding of a plasma discharge (PL) in a sputter chamber (1), comprising:
   at least one high frequency generator (5) comprising a controlled switching unit (13) by means of which a high frequency supply signal generated at an output (5$a$) of the high frequency generator (5) is deactivated during at least a first time interval ($t_A$), the first time interval being substantially shorter than a second ($t_B$) time interval, during which the high frequency supply signal is present at said output, said controlled switching unit (13) comprising a control input (13$_S$) operationally connected to the output of an arc detection unit (60).

2. A supply unit as claimed in claim 1, wherein the high frequency generator (5) comprises an electric supply unit (7)

whose output (7a) is operationally connected with a high frequency oscillator (9), wherein the controlled switching unit (13) is provided between the output (7a) of the supply unit (7) of the high frequency generator (5) and the output (5a) of the generator (5).

3. A supply unit as claimed in claim 1, wherein the arc detection unit (60) comprises a DC potential measuring unit whose output is operationally connected to the input of an adjustable threshold value detection unit (62), whose output is operationally connected to the control input ($13_S$).

4. A supply unit as claimed in claim 1, wherein the first time interval ($t_A$) is maximally 40 μsec.

5. A supply unit as claimed in claim 4, wherein the first time interval ($t_A$) is maximally 30 μsec.

6. A supply unit as claimed in claim 1, wherein a time interval starting with the occurrence of a signal triggering the arc detection unit (60) to the triggering of the first time interval ($t_A$) is maximally 50 μsec.

7. A supply unit as claimed in claim 1, wherein a time interval starting with the occurrence of a signal triggering the arc detection unit (60) to the triggering of the first time interval ($t_A$) is maximally 30 μsec.

8. A supply unit as claimed in claim 1, wherein the controlled switching unit comprises a monostable unit, which deactivates the high frequency supply signal, triggered by a detection signal at the output of the arc detection unit (60), for an adjustable time interval ($t_A$).

9. A supply unit as claimed in claim 1, wherein the control input of the controlled switching unit is additionally operationally connected to a free-running clock unit (15), which repetitively deactivates the high frequency supply signal during further first time intervals ($t_A$).

10. A supply unit as claimed in claim 1, wherein additionally a DC generator (25) is provided, whose output signal is superimposed on that of the high frequency generator (5).

11. A supply unit as claimed in claim 10, wherein the DC generator (25) comprises a further controlled switching unit (33) by means of which a DC supply signal generated at the output of the DC generator (25), is deactivated during at least a third time interval ($t_C$), which is significantly shorter than fourth time intervals ($t_D$), during which the DC supply signal is present at said output.

12. A supply unit as claimed in claim 11, wherein a control input ($33_S$) of the further controlled switching unit (33) of the DC generator (25) is operationally connected to the output of the arc detection unit (60).

13. A supply unit as claimed in claim 11, wherein the control input ($13_S$) of the controlled switching unit (13) of the high frequency generator (5) and of a control input ($33_S$) of the further controlled switching unit (33) of the DC generator (25) are operationally connected across a timing transmitter (15, 43, 35) such that the third time interval ($t_C$) starts before the first ($t_A$) and ends before or after the first time interval ($t_A$).

14. A supply unit as claimed in claim 10, wherein the control input ($13_S$) of the controlled switching unit (13) of the high frequency generator (5) and of the control input ($33_S$) of the controlled switching unit (33) of the DC generator (25) are operationally connected across a timing transmitter (15, 43, 35) such that the third time interval ($t_C$) starts before the first ($t_A$) and ends before the first time interval ($t_A$).

15. A supply unit as claimed in claim 1, including, in combination with the supply unit, a sputter coating installation with a metal oxide target.

16. A supply unit as claimed in claim 1, including, in combination with the supply unit, a sputter coating installation with an ITO target.

17. A supply unit as claimed in claim 1, including, in combination with the supply unit, a magnetron.

18. A method for reduction of arcing during sputtering, in which the plasma discharge (PL) is at least conjointly supplied by means of high frequency energy, wherein the high frequency supply of the plasma discharge is briefly ($t_A$) deactivated on detection (60) of an arc development.

19. A method as claimed in claim 18, wherein the high frequency supply is deactivated without deactivation of an electric supply (7) of an high frequency generator (5) for generating the high frequency supply.

20. A method as claimed in claim 18, wherein the arc development is detected by measuring a DC potential on the plasma discharge.

21. A method as claimed in claim 18, wherein the high frequency supply is deactivated during maximally 40 μsec.

22. A method as claimed in claim 18, wherein the high frequency supply is deactivated during maximally 30 μsec.

23. A method as claimed in claim 18, wherein, starting from the detection of the arc development, the high frequency supply is deactivated after maximally 50 μsec.

24. A method as claimed in claim 18, wherein, starting from the detection of the arc development, the high frequency supply is deactivated after maximally 30 μsec.

25. A method as claimed in claim 18, wherein the high frequency supply is additionally repetitively deactivated.

26. A method as claimed in claim 18, wherein the high frequency supply is additionally repetitively periodically deactivated.

27. A method as claimed in claim 18, wherein the plasma discharge is additionally fed by means of a DC supply (25).

28. A method as claimed in claim 18, wherein the DC supply is briefly deactivated.

29. A method as claimed in claim 28, wherein the DC supply is deactivated based on the detection of the development of an arc.

30. A method as claimed in claim 28, wherein the DC supply is deactivated before the high frequency supply.

31. A method as claimed in claim 30, wherein the DC supply is restored again before or after the high frequency supply is restored.

32. A method as claimed in claim 30, wherein the DC supply is restored again before the high-frequency supply.

33. A method for the fabrication of structural components with a sputter method in which the supply of the sputter plasma discharge comprises at least one high frequency component, and wherein the high frequency supply component is briefly deactivated, controlled by a deactivating switch which is controlled by an arc detection unit.

* * * * *